(12) United States Patent
Liu et al.

(10) Patent No.: US 9,397,585 B2
(45) Date of Patent: Jul. 19, 2016

(54) MEMS SHOCK CUSHION SPRING SYSTEMS AND METHODS

(71) Applicant: DigitalOptics Corporation MEMS, Arcadia, CA (US)

(72) Inventors: Xiaolei Liu, Arcadia, CA (US); Xiaojun Huang, Arcadia, CA (US); Robert J. Calvet, Arcadia, CA (US)

(73) Assignee: DIGITALOPTICS CORPORATION MEMS, Arcadia, CA (US)

( * ) Notice: Subject to any disclaimer, the term of this patent is extended or adjusted under 35 U.S.C. 154(b) by 600 days.

(21) Appl. No.: 13/842,832

(22) Filed: Mar. 15, 2013

(65) Prior Publication Data

US 2013/0278108 A1 Oct. 24, 2013

Related U.S. Application Data

(63) Continuation-in-part of application No. 12/946,515, filed on Nov. 15, 2010, now Pat. No. 8,619,378, and a continuation-in-part of application No. 13/247,898, filed on Sep. 28, 2011, now Pat. No. 8,768,157.

(51) Int. Cl.
| | |
|---|---|
| *G02B 7/02* | (2006.01) |
| *G02B 26/08* | (2006.01) |
| *G02B 26/00* | (2006.01) |
| *H02N 1/00* | (2006.01) |
| *B81C 3/00* | (2006.01) |
| *G02B 7/08* | (2006.01) |
| *G03B 3/10* | (2006.01) |
| *B81C 1/00* | (2006.01) |

(52) U.S. Cl.
CPC ............ *H02N 1/008* (2013.01); *B81C 1/00825* (2013.01); *B81C 3/00* (2013.01); *G02B 7/08* (2013.01); *G03B 3/10* (2013.01); *B81B 2201/033* (2013.01); *G03B 2205/0007* (2013.01); *G03B 2205/0053* (2013.01); *G03B 2205/0061* (2013.01); *Y10T 29/49002* (2015.01)

(58) Field of Classification Search
CPC ........... G02B 26/0841; G02B 26/0825; H04N 5/7425; G02F 1/29; G03B 21/625; G03B 21/602; G03B 21/62
USPC ......... 359/223–225, 290–293, 295, 316, 453, 359/455–456, 460, 846, 315
See application file for complete search history.

(56) References Cited

U.S. PATENT DOCUMENTS

| | | | |
|---|---|---|---|
| 6,384,510 B1 | 5/2002 | Grade et al. | |
| 2002/0067103 A1 | 6/2002 | Jerman | |
| 2006/0024880 A1* | 2/2006 | Chui | B81B 3/001 438/222 |
| 2007/0216888 A1 | 9/2007 | Kugler et al. | |
| 2011/0188104 A1* | 8/2011 | Tachibana | B81B 3/0051 359/199.2 |
| 2012/0032286 A1 | 2/2012 | Trusov et al. | |
| 2012/0081598 A1 | 4/2012 | Calvet et al. | |

FOREIGN PATENT DOCUMENTS

WO   WO 99/37013   7/1999

* cited by examiner

*Primary Examiner* — Dawayne A Pinkney
(74) *Attorney, Agent, or Firm* — Haynes and Boone, LLP

(57) ABSTRACT

Techniques are disclosed for systems and methods to provide shock impact mitigation for MEMS structures. A MEMS structure may include one or more actuators. An actuator may include a first frame having a spine, where the spine includes a body and a tip. The actuator may include a second frame connected to the first frame and including a shock stop, where the shock stop includes a surface in proximity to the spine tip. An actuator may include a shock cushion spring fixed relative to the spine tip and situated substantially between the spine tip and the shock stop surface, where the shock cushion spring is adapted to protect the spine tip from contact with the shock stop surface.

22 Claims, 8 Drawing Sheets

MEMS SHOCK CUSHION SPRING SYSTEMS AND METHODS

CROSS-REFERENCE TO RELATED APPLICATIONS

This continuation-in-part patent application claims the benefit of and priority to U.S. patent application Ser. No. 12/946,515 filed Nov. 15, 2010 and entitled "ROTATIONAL COMB DRIVE Z-STAGE" which is hereby incorporated by reference in its entirety.

This continuation-in-part patent application claims the benefit of and priority to U.S. patent application Ser. No. 13/247,898 filed Sep. 28, 2011 and entitled "MULTIPLE DEGREE OF FREEDOM ACTUATOR" which is hereby incorporated by reference in its entirety.

TECHNICAL FIELD

One or more embodiments of the invention relate generally to shock mitigation in fabricated structures and more particularly, for example, to systems and methods for shock impact mitigation in microelectromechanical systems (MEMS).

BACKGROUND

Microelectromechanical systems (MEMS) structures are increasingly used to provide mechanical motion in miniaturized components, such as moveable lens assemblies used to provide auto-focus and/or image stabilization in handheld electronic devices. However, as MEMS structures get smaller, they become generally less powerful and more prone to damage due to physical shock, such as the forces experienced when an electronic device is dropped.

Conventional methods used to address fragility of MEMS structures, such as using thicker structures or stronger materials to form such structures, are typically at odds with the pressure to miniaturize such components. Thicker structures tend to reduce the area available for MEMS actuator structures, and stronger materials typically increase overall weight, thus resulting in weaker MEMS actuators that are even more susceptible to types of shocks, due to the increased weight. Thus, there is a need for an improved methodology to address shock impact mitigation in MEMS structures.

SUMMARY

Techniques are disclosed for systems and methods to provide shock impact mitigation for MEMS structures, such as MEMS structures including one or more actuators. In one embodiment, a shock impact mitigation system may include a shock cushion spring situated between structures that move relative to each other. Each shock cushion spring may be implemented with one or more attachment members and a compliant member adapted to protect MEMS structures experiencing a physical shock.

In one embodiment, an actuator includes a first frame having a spine, where the spine includes a spine body and a spine tip. The actuator may include a second frame coupled to the first frame, where the second frame includes a shock stop. The shock stop may include a shock stop surface in proximity to the spine tip. The actuator may include a shock cushion spring fixed relative to the spine tip and situated substantially between the spine tip and the shock stop surface, where the shock cushion spring is adapted to protect the spine tip from contact with the shock stop surface.

In another embodiment, a device includes a fixed frame, a platform that is moveable relative to the fixed frame, and an actuator interconnecting the fixed frame and the platform, where the actuator is adapted to move the platform in at least one degree of freedom. The actuator may include a first frame having a spine, where the spine includes a spine body and a spine tip; a second frame coupled to the first frame and including a shock stop, where the shock stop includes a shock stop surface in proximity to the spine tip; and a shock cushion spring fixed relative to the spine tip and situated substantially between the spine tip and the shock stop surface, where the shock cushion spring is adapted to protect the spine tip from contact with the shock stop surface.

In a further embodiment, a method includes forming a spine in a first frame of an actuator, where the spine includes a spine body and a spine tip; forming a shock stop in a second frame of the actuator, where the shock stop includes a shock stop surface in proximity to the spine tip; and forming a shock cushion spring fixed relative to the spine tip, where the shock cushion spring is adapted to protect the spine tip from contact with the shock stop surface.

The scope of the invention is defined by the claims, which are incorporated into this section by reference. A more complete understanding of embodiments of the invention will be afforded to those skilled in the art, as well as a realization of additional advantages thereof, by a consideration of the following detailed description of one or more embodiments. Reference will be made to the appended sheets of drawings that will first be described briefly.

BRIEF DESCRIPTION OF THE DRAWINGS

Embodiments of the invention and their advantages are best understood by referring to the detailed description that follows. It should be appreciated that like reference numerals are used to identify like elements illustrated in one or more of the figures.

DETAILED DESCRIPTION

In accordance with various embodiments of the present disclosure, shock impact mitigation systems and methods may advantageously include a shock cushion spring strategically situated between various MEMS structures and adapted to protect such structures and their constituent MEMS devices from chipping, breaking, and other structural damage due to physical shock. By providing a relatively small but robust protective structure, embodiments of the present disclosure provide for more compact, more variable, and/or more powerful MEMS actuator implementations while increasing overall reliability of constituent MEMS devices.

Figure 1:
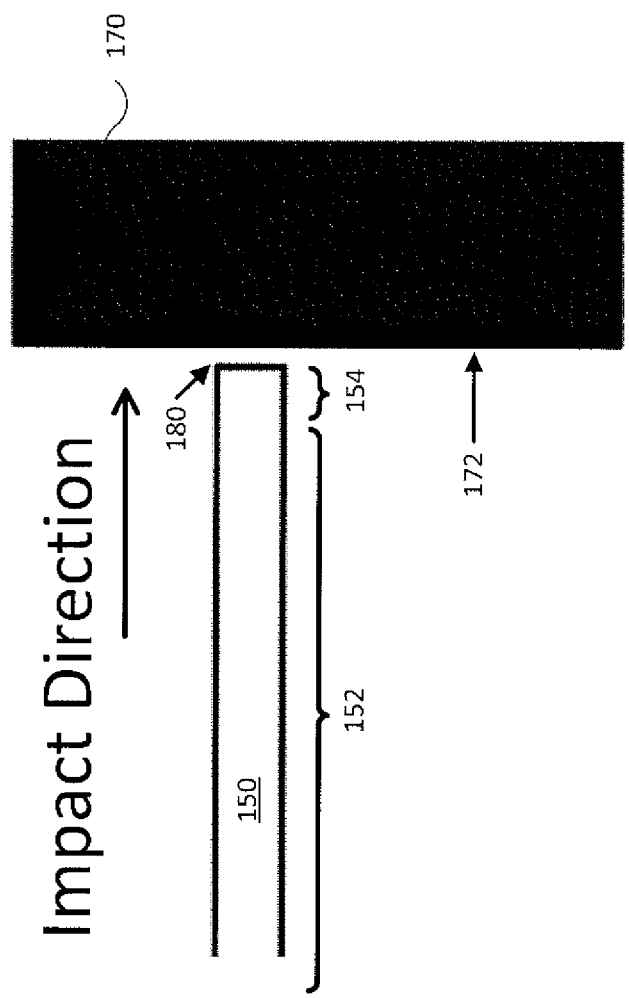
FIG. 1 illustrates a block diagram of a MEMS structure experiencing a shock impact.

FIG. 1 illustrates a block diagram of a MEMS structure 100 experiencing a shock impact in accordance with an embodiment of the disclosure. In the embodiment shown in FIG. 1, structure 100 shows a spine 150 separated from a shock stop surface 172 of a shock stop 170 by a gap 180. For example, spine 150 may form a portion of a first frame of an actuator, and shock stop 170 may form a portion of a second frame of the actuator, where the frames are configured to move relative to each other, substantially in directions parallel to shock stop surface 172, when the actuator is energized. As shown in FIG. 1, tip 154 of spine 150 is being driven into shock stop surface 172 by an external physical shock, such as when a larger device including structure 100 is dropped on a floor, for example.

In some embodiments, a MEMS actuator may be implemented as a number of paired comb structures adapted to cause portions of the actuator to move when a voltage difference is developed between each pair. For example, a first frame of an actuator may be substantially electrically isolated from a second frame of the actuator, and each pair of comb structures may be split between the actuator frames so that the voltage difference can be developed. Relative alignment of each comb structure pair, and thereby each actuator frame, is typically crucial to proper operation of the actuator, and even minimal physical contact between comb pairs can irreparably damage the actuator, in addition to causing the comb pairs to electrically short to each other and spontaneously de-energize the actuator.

In some embodiments, body 152 of spine 150 may provide structural support for a number of such comb structures (e.g., not shown in FIG. 1, for clarity). For example, spine body 150 may be adapted to support comb structures on each long side of spine body 152, and corresponding comb structures may be fixed relative to, for example, shock stop surface 172 to form paired structures for an actuator. In such embodiments, a length of spine 150, including spine body 152 and tip 154, and a width of gap 180 may be selected to limit actuator frame misalignment in a direction towards shock stop surface 172 and ensure paired comb structures do not contact each other, even when spine 150 contacts shock stop 170. In alternative embodiments, spine body 154 may not itself be adapted to structurally support comb structures, but spine 150 and gap 180 may still be adapted to sufficiently limit actuator frame misalignment, as described herein.

In particular, shock stop surface 172 may be adapted to limit relative motion of spine 150 towards shock stop 170, for example, so as to limit misalignment (e.g., in a direction towards shock stop surface 172) of comb structures structurally supported by spine 150 and/or situated elsewhere on a corresponding actuator frame. In some embodiments, multiple opposing spines and/or shock stops formed on one or more such actuator frames may limit misalignment of comb structures in directions both towards and away from shock stop surface 172, as described herein.

More generally, spine 150, spine tip 154, shock stop surface 172, and/or gap 180 may be adapted to substantially limit actuator misalignment through the full range of motion of an actuator, including contact between spine 150 and shock stop 170. However, spine tip 154 is typically relatively susceptible to physical damage when impacting shock stop surface 172.

If spine tip 154 is damaged during a shock, actuator and/or one or more individual comb structure alignment may be partially or permanently destroyed. Further, if spine tip 154 is chipped during a shock, such chips may lodge between spine tip 154 and shock stop surface 172 and misalign spine 150 or impede actuator motion, or such chips may migrate to other areas of the actuator and cause similar problems and/or various electrical shorts.

In some embodiments, a risk of physical damage may be reduced by increasing a thickness and/or material strength of spine 150, but such modifications typically reduce the total area available for comb structures while increasing the mass of spine 150. Reduced comb structure area equates to a less powerful and/or less variable actuator, and an increased mass reduces the available actuator power and the responsiveness of the actuator and makes the overall actuator more prone to damage due to physical shock.

Figure 2:
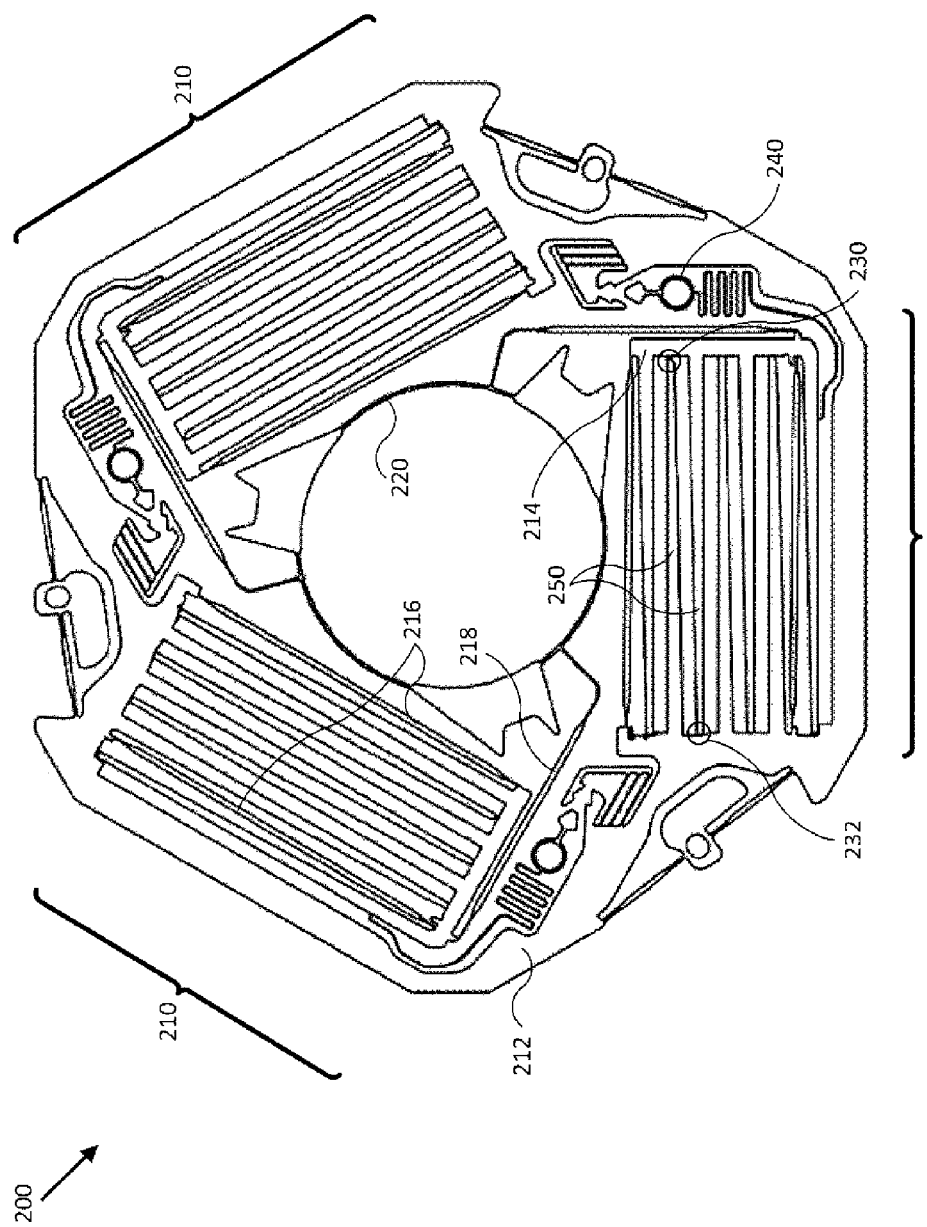
FIG. 2 illustrates a plan view of a MEMS structure including a shock impact mitigation system in accordance with an embodiment of the disclosure.

FIG. 2 illustrates a plan view of a MEMS structure 200 including a shock impact mitigation system in accordance with an embodiment of the disclosure. In the embodiment shown in FIG. 2, structure 200 includes three similarly constructed actuators 210 arranged to provide planar motion and/or rotation for a platform 220. For example, each actuator 210 may, at least in part, interconnect a fixed frame 212 and platform 220, and motion of each actuator 210 may be transferred to platform 220 through one or more actuator-platform flexures 218. In some embodiments, actuator-platform flexures 218 may be implemented as one or more cantilever flexures and/or other flexure types and/or orientations, for example.

MEMS structure 200 may be formed using a combination of various masking, patterning, deposition, growth, etching, and/or other fabrication steps and/or processes performed with respect to one or more materials (e.g., silicon, various metals, various insulators, and/or various semiconductor materials), layers of materials, and/or types of materials (e.g., crystalline, polycrystalline, amorphous, and/or various solid states of matter), for example. For example, flexures of MEMS structure 200 may be implemented as a combination of etched layers of a silicon substrate and one or more metalized layers of varying thickness deposited (e.g., chemical vapor deposition, and/or other methods of deposition) on the etched silicon using various patterning, masking, lift-off, and other fabrication processes. Additionally, various portions of MEMS structure 200 may be fabricated separately and then welded, soldered, epoxied, and/or otherwise moveably and/or fixedly coupled together to form MEMS structure 200.

Each actuator 210 in FIG. 2 may be implemented with first and second frames substantially arranged in a plane and moveably connected to each other through one or more intra-actuator flexures 216. For example, as presented in FIG. 2, each actuator 210 may be implemented with a portion of fixed frame 212 as a first frame, and with moveable frame 214 as a second frame moveably connected to fixed frame 212 by one or more intra-actuator flexures 216. In some embodiments, intra-actuator flexures 216 may be parallel motion flexures allowing each moveable frame 214 to move radially with respect to a center of platform 220 and/or substantially parallel to a corresponding portion of fixed frame 214 that defines actuator 210. Each actuator 210 may also be implemented with one or more other structural and/or electrical features, such as snub 240, for example, which may be used to limit motion of and/or provide an electrical connection to moveable frame 214.

Also shown in FIG. 2 are circles 230 and 232 indicating various portions of actuator 210 including a shock mitigation system in accordance with embodiments of the present disclosure. For example, each actuator 210 may include one or more spines 250 that form a portion of a first frame of actuator 210 (e.g., fixed frame 212) and/or a portion of a second frame of actuator 210 (e.g., moveable frame 214). As noted herein, in some embodiments, spines 250 may be adapted to provide structural support for comb structures of actuator 210 (e.g., not shown in FIG. 2, for clarity), for example, and/or may be adapted to help limit frame misalignment of actuator 210.

Figure 3:
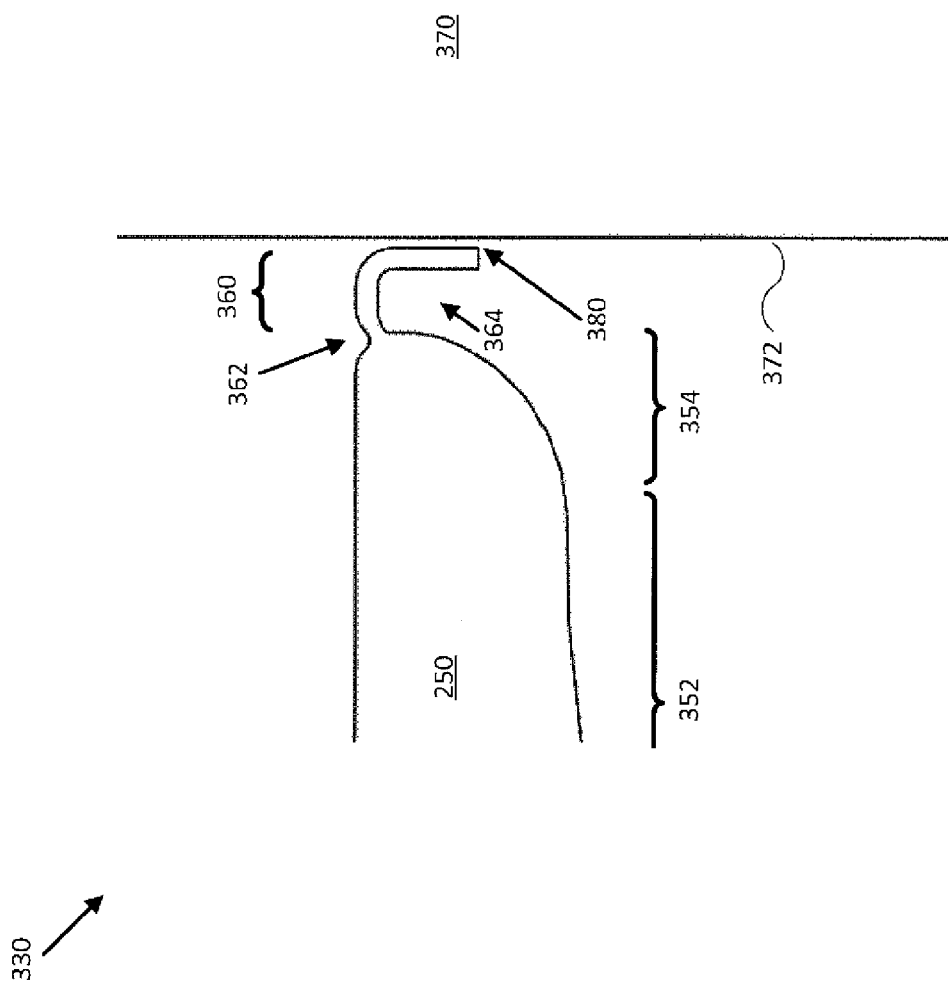
FIG. 3 illustrates a plan view of a shock impact mitigation system in accordance with an embodiment of the disclosure.

FIG. 3 illustrates a plan view of a shock impact mitigation system 330 in accordance with an embodiment of the disclosure. In the embodiment shown in FIG. 3, system 330 may correspond to the portion of actuator 210 in FIG. 2 indicated by circle 230, for example, where shock stop 370 forms a portion of moveable frame 214. Also indicated in FIG. 3 are body 352 and tip 354 of spine 250, shock cushion spring 360 including attachment member 362 and compliant member 364, and gap 380 between shock cushion spring 360 and shock stop surface 372. Shock stop surface 372 may be located in proximity to spine tip 354, for example, and may be adapted to limit relative motion of spine 250 towards shock stop 370, for instance, and/or to limit a range of relative motion of frames 212 and 214.

As shown in FIG. 3, shock cushion spring 360 may be fixed relative to spine tip 354, for example, and/or be situated substantially between spine tip 354 and shock stop surface 372. Various characteristics of shock cushion spring 360 may be adapted to protect spine tip 354 from damage when system 330 experiences a shock that moves spine 250 towards shock stop 370, for example, and/or from contact with shock stop surface 372. For example, in some embodiments, shock cushion spring 360 may be implemented with an attachment member 362 and a compliant member 364. Compliant member 364 may be adapted to flex in response to contact with shock stop 370 and substantially return to an initial and/or rest shape when subsequently not in contact with shock stop 370. Attachment member 362 may be adapted to fix a portion of compliant member 364 (e.g., an end of compliant member 364) relative to spine tip 354 and/or provide structural support for compliant member 364. A shape and/or placement of attachment member 362 with respect to spine tip 354, for example, and/or a shape of compliant member 364, may be adapted to provide an increased or reduced overall flex range of shock cushion spring 360. In other embodiments, such characteristics of shock cushion spring 360 may be adapted to select a particular flex force gradient (e.g., as a function of flex of shock cushion spring 360).

For example, an angle of attachment between attachment member 362 and spine tip 354 (e.g., measured relative to a normal vector of shock stop surface 372, where a zero degree angle of attachment may correspond to attachment member 362 being substantially perpendicular to shock stop surface 372, for example) may, in some embodiments, be increased to increase a flex range and/or decrease a flex force gradient of shock cushion spring 360. In the embodiment shown in FIG. 3, the angle of attachment is roughly forty-five degrees. In other embodiments, a length of compliant member 364 that is configured to contact shock stop surface 372 may be increased to increase a flex range and/or decrease a flex force gradient of shock cushion spring 360. In still further embodiments, a length and/or one or more angles of compliant member 364, such as those characterizing a transition from attachment member 362 to portions of compliant member 364 configured to contact shock stop surface 372, for example, may be adapted to adjust a flex range and/or a flex force gradient of shock cushion spring 360, and/or may be adapted to localize at least a majority of the flex allowed by shock cushion spring 360 to a particular portion of shock cushion spring 360.

In some embodiments, shock cushion spring 360, including attachment member 362 and compliant member 364, may be etched from the same material(s) forming spine 250. In other embodiments, one or more of attachment member 362 and/or compliant member 364 may be formed (e.g., though various fabrication processes, as described herein) of one or more materials and/or types of materials different from those used to form spine 250. For example, in one embodiment, spine 250 and compliant member 364 may be formed substantially of polysilicon, and attachment member 362 may be implemented as one or more metal layers, for instance, or formed substantially of crystalline silicon. In other embodiments, both spine 250 and shock cushion spring 360 may be formed substantially of polysilicon. Various materials may be selected to increase, decrease, and/or otherwise adjust a flex range and/or flex force gradient of shock cushion spring 360, for example, and/or to adapt shock cushion spring 360 to various size restrictions and/or travel/misalignment limits imposed by associated structure in a constituent MEMS device.

Also shown in FIG. 3 is gap 380. Gap 380 (e.g., a width of gap 380) may be adapted to separate shock cushion spring 360 from shock stop 370 and allow spine 250 and shock stop 370 to move relative to each other in one or more directions substantially parallel to shock stop surface 372. In embodiments where spine 250 is a portion of a frame of an actuator (e.g., fixed frame 212 of actuator 210 in FIG. 2) and shock stop 370 is a portion of another frame of the actuator (e.g., movable frame 214 of actuator 210 in FIG. 2), gap 380 may be adapted to allow the frames to move relative to each other in directions substantially parallel to shock stop surface 372, and the directions and/or the width of gap 380 may depend, at least in part on physical characteristics of intra-actuator flexures (e.g., intra-actuator flexures 216 of FIG. 2) connecting the frames. For example, where intra-actuator flexures 216 are parallel motion flexures, the directions of motions allowed by gap 380 may be substantially vertical, as depicted in FIG. 3.

In addition to characteristics of shock cushion spring 360, characteristics of other structures in system 330 may be adapted to adjust operation of shock cushion spring 360. For example, spine tip 354 may be formed with a curved profile (e.g., as shown in FIG. 3) to allow room for compliant member 364 of shock cushion spring 360 to flex without contacting and/or damaging spine tip 354. In other embodiments, a profile of spine tip 354 may be adapted to provide for one or more additional shock cushion springs, for example, or shock cushion springs having a different shape from shock cushion spring 360. For example, in the embodiment shown in FIG. 3, shock cushion spring 360 may roughly be described as having a shape of the letter "J". Other shapes are contemplated, such as an "O" shape, a "T" shape, a "V", "W", or "Z" shape, a "Y" shape, and/or various combinations of such shapes (e.g., an "R" shape), as described herein.

Although FIG. 3 illustrates a single shock impact mitigation system 330, it should be appreciated that a MEMS actuator may include multiple such shock impact mitigation systems, and the systems may be implemented wherever one frame (moveable or fixed) of an actuator includes structures (e.g., spines 250) adapted to limit physical actuator misalignment through contact with a surface of another frame of the actuator (e.g., through shock and/or other types of actuator motion). For example, as shown in FIG. 2, circles 230 and 232 indicate two potential areas of actuator 210 in which embodiments of shock impact mitigation system 330 may be implemented. As shown in FIG. 2, the two potential areas indicated by circles 230 and 232 are arranged opposite each other and can, together, limit actuator misalignment in directions towards and away from, for example, shock stop surface 372.

By providing a relatively small but robust protective structure, embodiments of shock cushion spring 360 allow spine body 354 and/or spine tip 354 to be thinner than in conventional MEMS structures without risking damage and/or reduced reliability due to shock. Furthermore, a width of gap 380 may be smaller than in conventional MEMS structures due to reliance on a flex ability of shock cushion spring 360 rather than on a relatively inflexible and fragile conventional spine tip. As such, embodiments of system 330 provide for increased overall alignment and more area for comb structures and/or other actuator force structures, for example, which can result in more compact, more variable, and/or more powerful MEMS actuator implementations while increasing overall reliability of constituent MEMS devices.

For example, in one embodiment, system 330 may form a part of an actuator that is used to adjust lens positions and/or positions of other optical devices in a camera module. In one embodiment, a camera module may include a lens barrel or other lens housing component adapted to provide structural support and/or environmental protection for one or more lenses and/or corresponding MEMS actuators. In a related embodiment, a camera module may include an image sensor and one or more actuators adapted to move optical elements relative to the image sensor. In further embodiments, a camera module may be integrated with (e.g., electrically coupled to, soldered to, mechanically coupled to) a digital camera, a smartphone, a personal digital assistant, a tablet computer, a notebook computer, a kiosk (e.g., a sales kiosk, an ATM, and/or other types of kiosks), a portable electronic device, and/or other electronic devices, for example.

Figure 4:
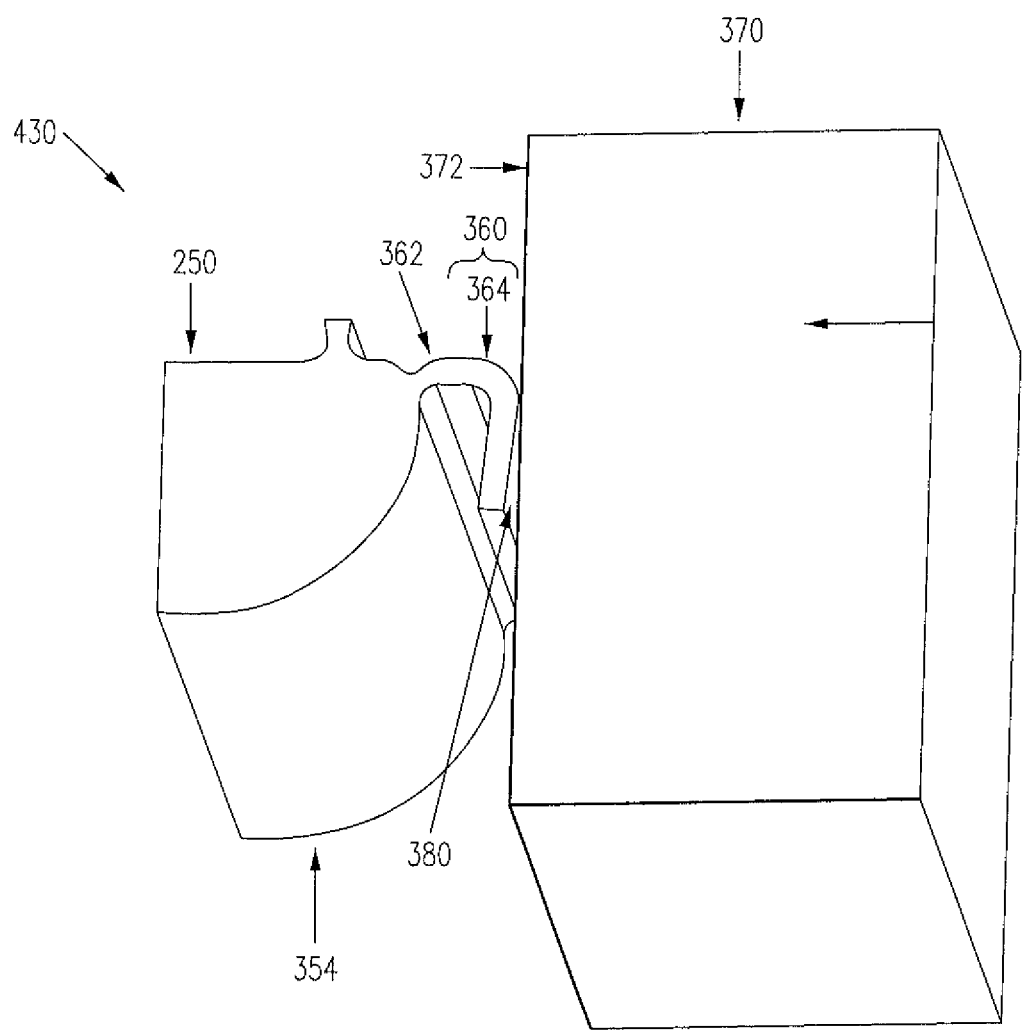
FIG. 4 illustrates a perspective view of a shock impact mitigation system in accordance with an embodiment of the disclosure.

FIG. 4 illustrates a perspective view of shock impact mitigation system 330 of FIG. 3 in accordance with an embodiment of the disclosure. As shown in FIG. 4, shock cushion spring 360 may be implemented with a depth (e.g., a long dimension of shock cushion spring 360) that is substantially the same as the depth of spine 250. In other embodiments, a depth of shock cushion spring 360 may be less than or more than a depth of spine 250. In further embodiments, a depth of shock cushion spring 360 may be substantially the same as or different from a depth of spine 250 and/or shock stop surface 372.

In some embodiments, spine 250 may form a portion of a first frame of an actuator and shock stop 370 may form a portion of a second frame of the actuator, where the frames are adapted to move relative to each other. For example, as shown in circle 230 of FIG. 2, spine 250 may form a portion of fixed frame 212 and shock stop 370 may form a portion of movable frame 214, and frames 212 and 214 may be arranged substantially in a plane and be adapted to move relative to each other in the plane when actuator 210 is energized. In such embodiments, a long dimension of shock cushion spring 360 (e.g., corresponding to a depth of shock cushion spring 360) may be substantially perpendicular to the plane in which frames 212 and 214 are arranged. In such arrangement, a width of gap 380 and a depth of shock cushion spring 360 that overlays shock stop surface 372 may be substantially constant over the full range of motions selected by energizing actuator 210. Further, a range of friction caused by typical actuator motion and incidental and/or shock contact between shock cushion spring 360 and shock stop surface 372 may be selected by adjusting a length of the portion of compliant member 364 substantially parallel to shock stop surface 372, a depth of shock cushion spring 360, and/or a depth of shock stop surface 372.

In other embodiments, first and second frames of an actuator may be adapted to rotate relative to each other when the actuator is energized (e.g., using appropriately situated comb structures and/or flexures, as described herein). For example, as shown FIG. 6, moveable frame 614 may be adapted to rotate relative to fixed frame 612 (e.g., about intra-actuator flexures 616) such that frames 612 and 614 move vertically (e.g., in or out of the page of FIG. 6) in a direction of the rotation. In such embodiments, a long dimension of shock cushion spring 360 may be substantially parallel to a direction of the rotation. In such arrangement, a depth of shock stop surface 372 may be selected to ensure that the depth of shock cushion spring 360 overlaying shock stop surface 372 is substantially constant over the full range of motions selected by energizing actuator 610. Further, a range of friction caused by typical actuator motion and incidental and/or shock contact between shock cushion spring 360 and shock stop surface 372 may be selected adjusting a length of the portion of compliant member 364 substantially parallel to shock stop surface 372, a depth of shock cushion spring 360, and/or a depth and/or vertical placement of shock stop surface 372.

Figure 5:
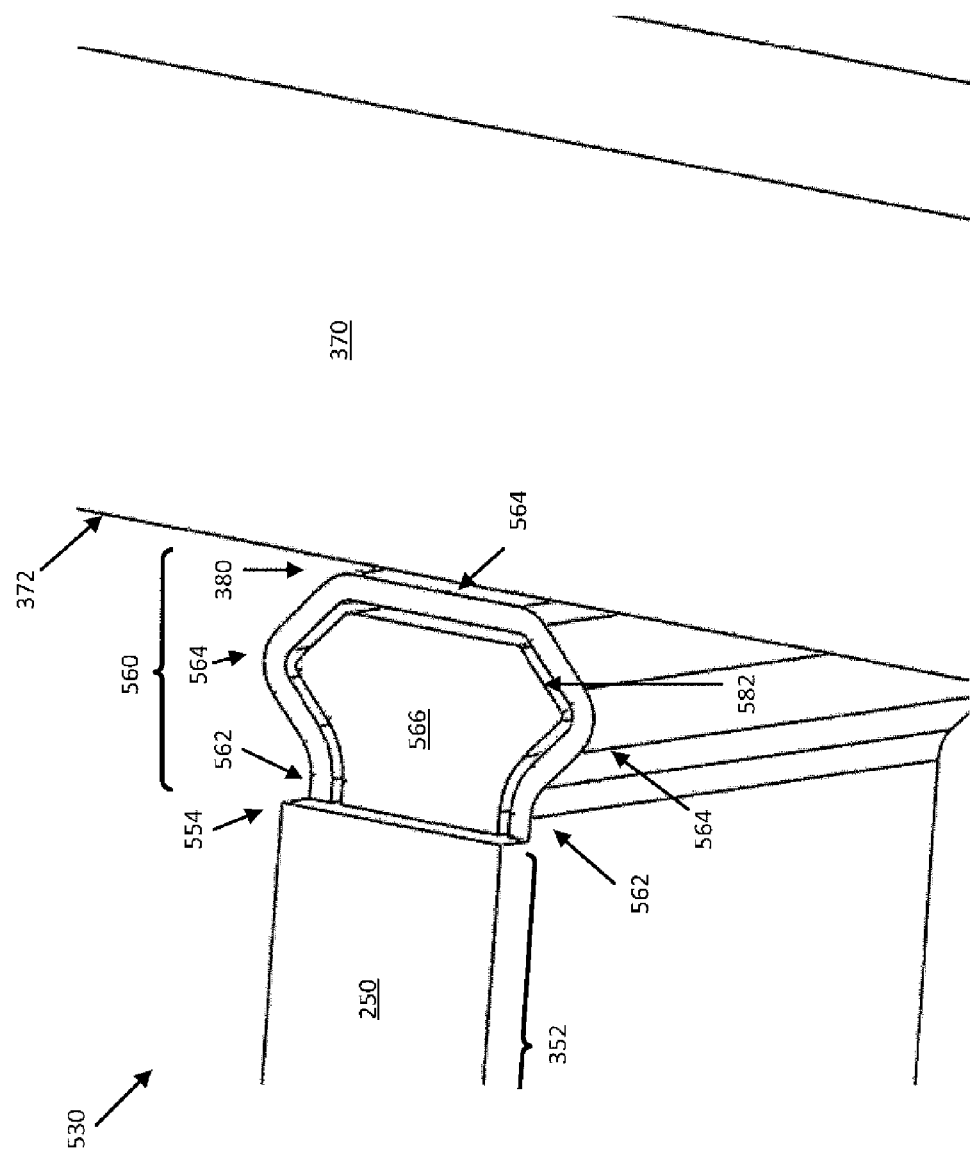
FIG. 5 illustrates a perspective view of a shock impact mitigation system in accordance with an embodiment of the disclosure.

FIG. 5 illustrates a perspective view of a shock impact mitigation system 530 in accordance with an embodiment of the disclosure. In the embodiment shown in FIG. 5, system 530 may correspond to the portion of actuator 210 in FIG. 2 indicated by circle 230, for example, where shock stop 370 forms a portion of moveable frame 214. Also indicated in FIG. 5 are body 352 and tip 554 of spine 250, shock cushion spring 560 including attachment members 562 and compliant member 564 and travel limiter 566, and gap 380 between shock cushion spring 560 and shock stop surface 372. Shock stop surface 372 may be adapted to limit relative motion of spine 250 towards shock stop 370.

As shown in FIG. 5, shock cushion spring 560 may be fixed relative to spine tip 554, for example, and/or be situated substantially between spine tip 554 and shock stop surface 372. Various characteristics of shock cushion spring 560 may be adapted to protect spine tip 554 from damage when system 530 experiences a shock that moves spine 250 towards shock stop 370. For example, in some embodiments, shock cushion spring 560 may be implemented with multiple attachment members 562, a compliant member 564, and travel limiter 566. Compliant member 564 may be adapted to flex in response to contact with shock stop 370 and substantially return to an initial and/or rest shape when subsequently not in contact with shock stop 370. Attachment members 562 may be adapted to fix multiple different portions of compliant member 564 (e.g., opposite ends of compliant member 564, and/or a central portion of compliant member 564) relative to spine tip 354 and/or provide structural support for compliant member 364. In some embodiments, travel limiter 566 may be fixed relative to spine tip 554 and situated substantially between spine tip 554 and compliant member 564. In various embodiments, travel limiter 566 may be separated from compliant member 564 by gap 582. Gap 582 may be adapted to allow compliant member 564 to flex in response to contact with shock stop 370 until compliant member 564 contacts travel limiter 566.

A shape and/or placement of each of attachment members 562 with respect to spine tip 554, a shape of compliant member 564, a shape of travel limiter 566, and/or a width of gap 582, for example, may be adapted to provide an increased or reduced overall flex range of shock cushion spring 560. In other embodiments, such characteristics of shock cushion spring 560 may be adapted to select a particular flex force gradient (e.g., as a function of flex of shock cushion spring 560).

For example, each angle of attachment between attachment members 562 and spine tip 554 may, in some embodiments, be increased to increase a flex range and/or decrease a flex force gradient of shock cushion spring 560. In the embodiment shown in FIG. 5, the angle of attachment is roughly zero degrees. In other embodiments, a length of compliant member 564 that is configured to contact shock stop surface 372 may be increased to increase a flex range and/or decrease a flex force gradient of shock cushion spring 560. In still further embodiments, various lengths and/or angles of compliant member 564, such as those characterizing transitions from attachment members 562 to portions of compliant member 564 configured to contact shock stop surface 372, for example, may be adapted to adjust a flex range and/or a flex force gradient of shock cushion spring 560, and/or may be adapted to localize at least a majority of the flex allowed by shock cushion spring 560 to a particular portion of shock cushion spring 560.

In additional embodiments, a shape of travel limiter 566 and/or width of gap 582 may be adapted to adjust a flex range and/or a flex force gradient of shock cushion spring 560, to localize the flex allowed by shock cushion spring 560, and/or to protect one or more of attachment members 562 and/or compliant member 564 from damage due to hyper-flexure of compliant member 564 caused by, for example, an extreme shock. For example, in one embodiment, a shape of travel limiter 566 and/or a width of gap 582 may be adapted to limit flex of a portion of compliant member 564 up to a certain amount and force further flex of compliant member 564 to occur in one or more other areas of compliant member 564, thus distributing such flex over a larger portion of compliant member 564.

In some embodiments, shock cushion spring 560, including attachment members 562, compliant member 564, and travel limiter 566, may be etched from the same material(s) forming spine 250. In other embodiments, one or more of attachment members 562, compliant member 564, and/or travel limiter 566 may be formed (e.g., though various fabrication processes, as described herein) of one or more materials and/or types of materials different from those used to form spine 250. Various materials may be selected to increase, decrease, and/or otherwise adjust a flex range and/or flex force gradient of shock cushion spring 560, for example, and/or to adapt shock cushion spring 560 to various size restrictions and/or travel/misalignment limits imposed by associated structure in a constituent MEMS device.

In addition, various depths and/or vertical placements of spine tip 554, attachment members 562, compliant member 564, travel limiter 566, and/or shock stop surface 372 may be selected to ensure overlay of portions of compliant member 564 and shock stop surface 372, for example, and/or to select a range of friction caused by typical actuator motion and incidental and/or shock contact between shock cushion spring 560 and shock stop surface 372. For example, as shown in FIG. 5, a vertical position and overall depth of shock cushion spring 560 may be less than that for spine tip 554, resulting in the step feature between the top faces of spine tip 554 and attachment members 562. Such arrangement may be used to reduce a flex force gradient of shock cushion spring 560 without adjusting dimensions of other portions of system 530, for example, and thereby provide for cost effective tuning of shock mitigation characteristics without necessitating expensive structural adjustments to other portions of a constituent MEMS device.

Figure 6:
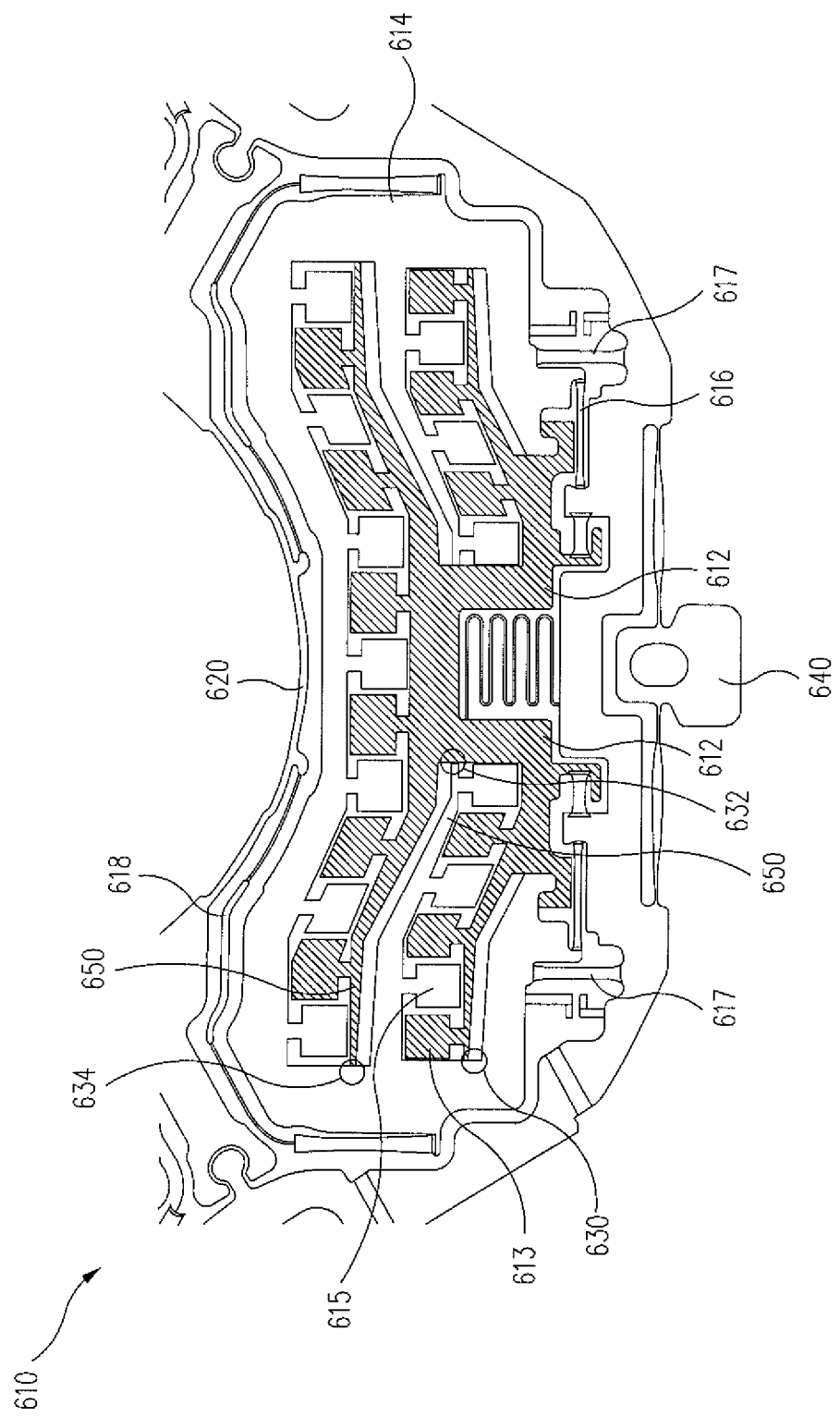
FIG. 6 illustrates a plan view of a MEMS structure including a shock impact mitigation system in accordance with an embodiment of the disclosure.

FIG. 6 illustrates a plan view of a MEMS structure (e.g., actuator 610) including a shock impact mitigation system in accordance with an embodiment of the disclosure. In one embodiment, actuator 610 may be implemented according to various techniques, structures, arrangements, and other methodologies set forth in U.S. patent application Ser. No. 12/946,515 filed Nov. 15, 2010 which is incorporated herein by reference in its entirety.

In the embodiment shown in FIG. 6, actuator 610 includes first and second frames (e.g., fixed frame 612 and moveable frame 614) adapted to rotate relative to each other when actuator 610 is energized and move at least a portion of platform 620 vertically (e.g., in one degree of freedom). As shown in FIG. 6, fixed frame 612 includes one or more spines 650 providing structural support for various comb structures 613 (e.g., shown in block form for clarity). Moveable frame 614, which may include similar comb structures 615, may be moveably connected to fixed frame 612 by intra-actuator flexures 616 and 617, where fixed frame 612 and moveable frame 614 are adapted to rotate relative to each other about intra-actuator flexures 616 when actuator 610 is energized. Actuator 610 may be adapted to interconnect, at least in part, fixed frame 612 and platform 620, for example, using one or more actuator-platform flexures 618. Intra-actuator flexures 616 and 617 and/or actuator-platform flexures 618 may be implemented as one or more parallel-motion flexures, cantilever flexures, and/or other types of flexures, for example. Actuator 610 may also be implemented with one or more other structural and/or electrical features, such as structure 640, for example, which may be used to limit motion of and/or provide an electrical connection to one of frames 612 and 614. Actuator 610 may be fabricated using any combination of the fabrication methods and/or processes described herein.

Also shown in FIG. 6 are various spines 650 and circles 630, 632, and 634 indicating potential areas where shock impact mitigation systems, such as shock impact mitigation system 330 of FIG. 3 and/or shock impact mitigation system 530 of FIG. 5 may be implemented, for example, using any of the methodologies described herein. For example, a long dimension of a shock cushion spring implemented according the present disclosure may be substantially parallel to a direction of rotation experienced by actuator 610 when actuator 610 is energized and/or de-energized. In one embodiment, such direction may be substantially vertical (e.g., in or out of the page of FIG. 6).

Figure 7:
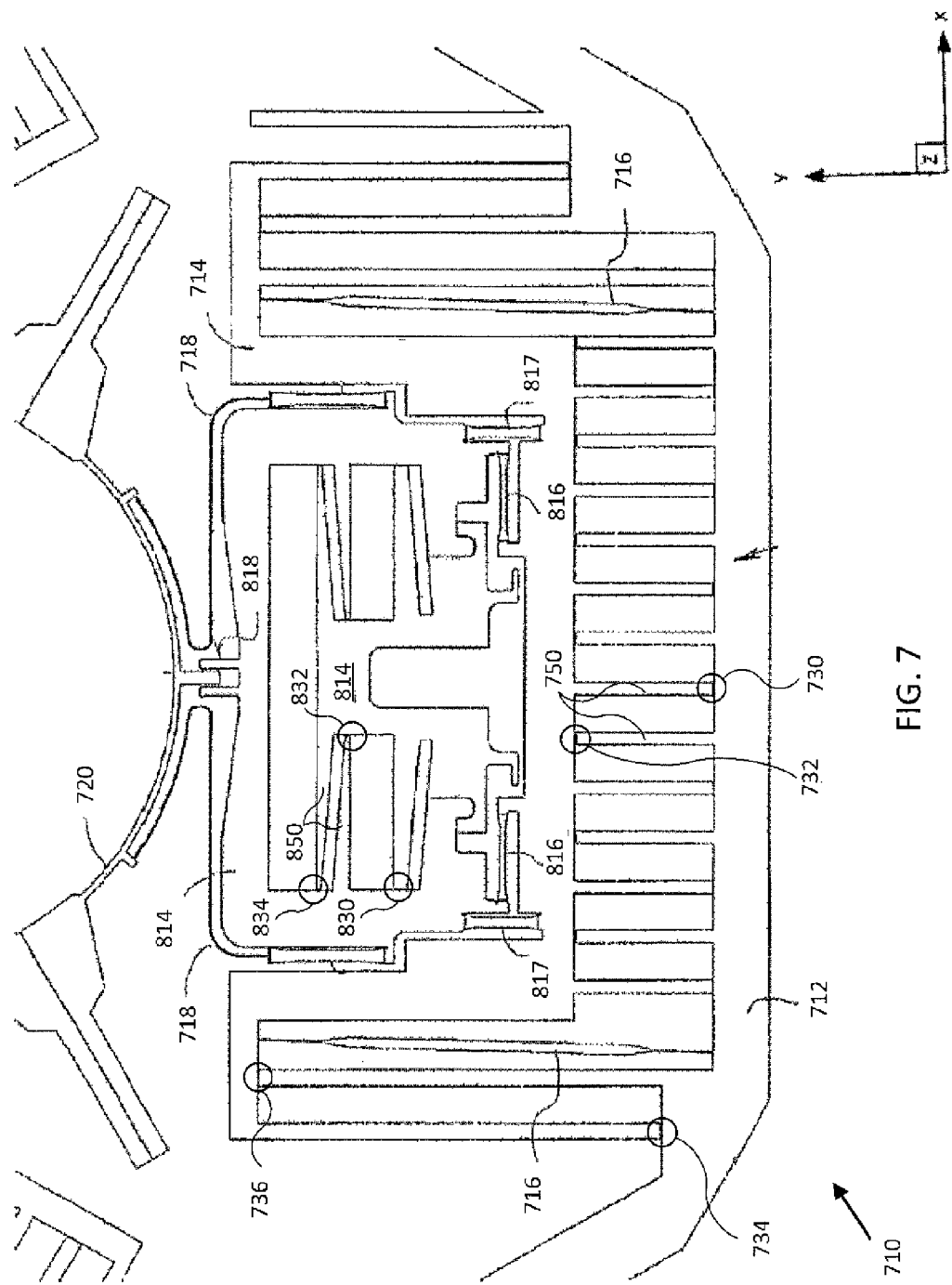
FIG. 7 illustrates a plan view of a MEMS structure including a shock impact mitigation system in accordance with an embodiment of the disclosure.

FIG. 7 illustrates a plan view of a MEMS structure (e.g., actuator 710) including a shock impact mitigation system in accordance with an embodiment of the disclosure. In one embodiment, actuator 710 may be implemented according to various techniques, structures, arrangements, and other methodologies set forth in U.S. patent application Ser. No. 13/247,898 filed Sep. 28, 2011 which is incorporated herein by reference in its entirety.

In the embodiment shown in FIG. 7, actuator 710 includes a first actuator defined by first and second frames (e.g., fixed frame 712 and moveable frame 714), and a second actuator defined by third and fourth frames (e.g., moveable frame 714 and moveable frame 814). For example, the first actuator of actuator 710 includes fixed frame 712 and moveable frame 714 arranged substantially in a plane and adapted to move relative to each other in the plane when the first actuator of actuator 710 is energized. The second actuator of actuator 710 includes moveable frame 714 and moveable frame 814 adapted to rotate relative to each other when the second actuator of actuator 710 is energized. Altogether, actuator 710 may be configured to provide two degrees of freedom motion (e.g., left-right and in-out of the page of FIG. 7) for at least a portion of platform 720, and a constituent MEMS device may include any number of actuators similar to actuator 710. Actuator 710 may be fabricated using any combination of the fabrication methods and/or processes described herein.

As shown in FIG. 7, fixed frame 712 and moveable frame 714 (e.g., the first actuator of actuator 710) may include a number of spines 750 and be moveably connected to each other by intra-frame flexures 716. Actuator 710 may be adapted to interconnect, at least in part, fixed frame 712 and platform 720 using actuator-platform flexures 718. Also shown are circles 730, 732, 734, and 736 indicating where shock impact mitigation systems, such as shock impact mitigation system 330 of FIG. 3 and/or shock impact mitigation system 530 of FIG. 5, may be implemented, for example, using any of the methodologies described herein. For example, a long dimension of a shock cushion spring implemented according the present disclosure may be substantially perpendicular to a direction of relative motion experienced by frames 712 and/or 714 when that portion of actuator 710 is energized and/or de-energized. In one embodiment, such direction may be substantially horizontal (e.g., left or right of the page of FIG. 7).

Additionally, moveable frame 714 and moveable frame 814 (e.g., the second actuator of actuator 710) may include a number of spines 850 and may be moveably connected to each other by intra-actuator flexures 816 and 817, where moveable frame 714 and moveable frame 814 are adapted to rotate relative to each other about intra-actuator flexures 816 when the second actuator of actuator 710 is energized. Actuator 710 may be adapted to interconnect, at least in part, moveable frame 714 and platform 720 using actuator-platform flexures 818. Also shown are circles 830, 832, and 834 indicating where shock impact mitigation systems may be implemented, for example, using any of the methodologies described herein. For example, a long dimension of a shock cushion spring implemented according the present disclosure may be substantially parallel to a direction of rotation experienced by moveable frames 714 and/or 814 when that portion of actuator 710 is energized and/or de-energized. In one embodiment, such direction may be substantially vertical (e.g., in or out of the page of FIG. 7).

Intra-actuator flexures 716, 816, and 817, and/or actuator-platform flexures 718 and 818, may be implemented as one or more parallel-motion flexures, cantilever flexures, and/or other types of flexures, for example. Actuator 710 may also be implemented with one or more other structural and/or electrical features, for example, which may be used to limit motion of and/or provide an electrical connection to one of frames 712, 714, and/or 814.

Figure 8:
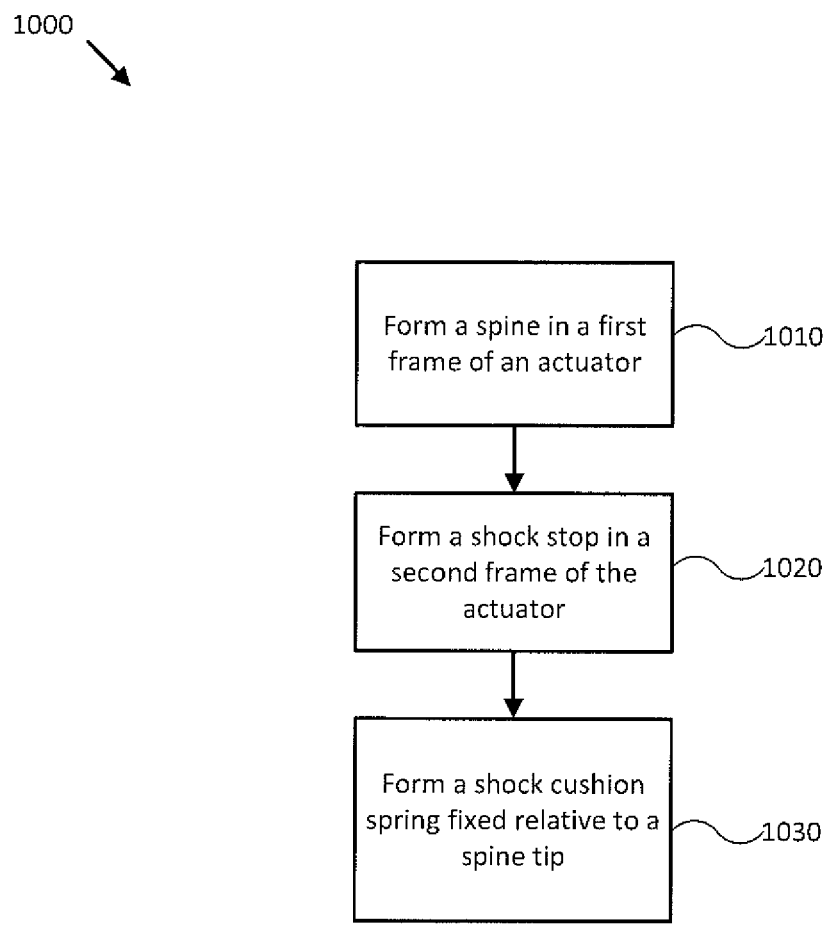
FIG. 8 illustrates a flow diagram of various operations to provide shock impact mitigation in accordance with an embodiment of the disclosure.

FIG. 8 illustrates a flow diagram of process 1000 to provide a shock impact mitigation system in accordance with an embodiment of the disclosure. In some embodiments, the operations of FIG. 8 may be implemented as software instructions executed by one or more logic devices used to implement a fabrication process. More generally, the operations of FIG. 8 may be implemented with any combination of software instructions, electronic hardware (e.g., inductors, capacitors, amplifiers, or other analog and/or digital components), and/or mechanical hardware used in a fabrication process, such as a MEMS fabrication process.

It should be appreciated that any step, sub-step, sub-process, or block of process 1000 may be performed in an order or arrangement different from the embodiment illustrated by FIG. 8. In addition, although blocks 1010-1030 are shown as separate blocks, blocks 1010-1030 may be performed at substantially the same time. Further, in some embodiments, any number of processes similar to process 1000 may be performed substantially simultaneously to produce multiple instances of shock impact mitigation systems throughout a MEMS actuator and/or device. Although process 1000 is described with reference to systems 200 and 330, process 1000 may be performed according to systems different from systems 200 and 330 and including a different selection of structural requirements. For example, although blocks 1010 and 1020 refer to forming structures in frames of an actuator, in other embodiments, blocks 1010 and/or 1020 may be adapted to form a spine and/or a shock stop, for example, in other types of MEMS structures that may or may not form a portion of an actuator. In one embodiment, block 1010 may be adapted to indicate forming a spine in a first portion of a MEMS device, for example, and/or block 1020 may be adapted to indicate forming a shock stop in a second portion of a MEMS device.

In block 1010, a shock impact mitigation system fabrication process includes forming a spine in a first frame of an actuator. For example, in one embodiment, a fabrication system may be adapted to pattern spine 250, including spine body 352 and/or spine tip 354, in fixed frame 212 of actuator 210. In some embodiments, spine 250 and fixed frame 212 may be formed from one or more materials (e.g., silicon) using a variety of etching, deposition, and/or other fabrication processes, for example. In various embodiments, block 1010 may be performed substantially simultaneously with process steps used to form other structures in fixed frame 212.

In block 1020, a shock impact mitigation system fabrication process includes forming a shock stop in a second frame of an actuator. For example, in one embodiment, a fabrication system may be adapted to pattern shock stop 370, including shock stop surface 372, in moveable frame 214 of actuator 210. In some embodiments, shock stop 370 and moveable frame 214 may be formed from one or more materials (e.g., silicon) using a variety of etching, deposition, and/or other fabrication processes, for example. In various embodiments, block 1020 may be performed substantially simultaneously with process steps used to form other structures in moveable frame 214. In some embodiments, block 1020 may be implemented to produce shock stop surface 372 adapted to limit relative motion of spine 250 towards shock stop 370.

In block 1030, a shock impact mitigation system fabrication process includes forming a shock cushion spring fixed relative to a spine tip. For example, in one embodiment, a fabrication system may be adapted to pattern shock cushion spring 360 out of fixed frame 212 of actuator 210, and thus fix shock cushion spring 360 relative to spine tip 354 formed in block 1010. In some embodiments, shock cushion spring 360, spine 250, and fixed frame 212 may be formed from similar materials (e.g., silicon) using a variety of etching, deposition, and/or other fabrication processes, for example. In other embodiments, shock cushion spring 360 may be formed from materials different from those used to form spine 250 and/or fixed frame 212. In various embodiments, block 1030 may be performed substantially simultaneously with process steps used to form other structures in fixed frame 212 and/or moveable frame 214. In some embodiments, block 1030 may be implemented to produce shock cushion spring 360 adapted to protect spine tip 354 from damage when actuator 210 experiences a shock that moves spine 250 towards shock stop 370.

Where applicable, various embodiments provided by the present disclosure can be implemented using hardware, software, or combinations of hardware and software. Also where applicable, the various hardware components and/or software components set forth herein can be combined into composite components comprising software, hardware, and/or both without departing from the spirit of the present disclosure.

Where applicable, the various hardware components and/or software components set forth herein can be separated into sub-components comprising software, hardware, or both without departing from the spirit of the present disclosure. In addition, where applicable, it is contemplated that software components can be implemented as hardware components, and vice-versa.

Software in accordance with the present disclosure, such as non-transitory instructions, program code, and/or data, can be stored on one or more non-transitory machine readable mediums. It is also contemplated that software identified herein can be implemented using one or more general purpose or specific purpose computers and/or computer systems, networked and/or otherwise. Where applicable, the ordering of various steps described herein can be changed, combined into composite steps, and/or separated into sub-steps to provide features described herein.

Embodiments described above illustrate but do not limit the invention. It should also be understood that numerous modifications and variations are possible in accordance with the principles of the invention. Accordingly, the scope of the invention is defined only by the following claims.

What is claimed is:

1. A microelectromechanical (MEMS) device comprising:
   a first frame comprising a spine, wherein the spine comprises a spine body and a spine tip;
   a second frame coupled to the first frame and comprising a shock stop, wherein the shock stop comprises a shock stop surface in proximity to the spine tip; and
   a shock cushion spring fixed to the spine tip and situated substantially between the spine tip and the shock stop surface, wherein the shock stop surface is adapted to limit a range of relative motion of the first and second frames, and wherein the shock cushion spring is adapted to protect the spine tip from contact with the shock stop surface.

2. The MEMS device of claim 1, wherein:
   the MEMS device comprises an actuator;
   the shock cushion spring is separated from the shock stop by a gap adapted to allow the first and second frames to move relative to each other in one or more directions substantially parallel to the shock stop surface; and
   the one or more directions and/or a width of the gap depend, at least in part, on physical characteristics of an intra-actuator flexure moveably connecting the first and second frames.

3. The MEMS device of claim 1, wherein the shock cushion spring comprises:
   a compliant member adapted to flex in response to contact with the shock stop and substantially return to an initial shape when not in contact with the shock stop; and
   one or more attachment members adapted to fix corresponding ends of the compliant member relative to the spine tip and provide structural support for the compliant member.

4. The MEMS device of claim 1, further comprising:
   a travel limiter fixed relative to the spine tip and situated substantially between the spine tip and a compliant member of the shock cushion spring, wherein the travel limiter is separated from the compliant member by a gap adapted to allow the compliant member to flex in response to contact with the shock stop until the compliant member contacts the travel limiter.

5. The MEMS device of claim 1, wherein:
   the second frame comprises a second spine comprising a second spine body and a second spine tip;
   the first frame comprises a second shock stop comprising a second shock stop surface in proximity to the second spine tip; and
   the MEMS device comprises a second shock cushion spring fixed relative to the second spine tip and situated substantially between the second spine tip and the second shock stop surface, wherein the second shock cushion spring is adapted to protect the second spine tip from contact with the second shock stop surface.

6. The MEMS device of claim 1, wherein:
   the MEMS device comprises an actuator;
   the first and second frames are adapted to rotate relative to each other when the actuator is energized; and
   a long dimension of the shock cushion spring is substantially parallel to a direction of the rotation.

7. The MEMS device of claim 1, wherein:
   the MEMS device comprises an actuator;
   the first and second frames are arranged substantially in a plane and are adapted to move relative to each other in the plane when the actuator is energized; and
   a long dimension of the shock cushion spring is substantially perpendicular to the plane.

8. The MEMS device of claim 1, wherein:
   the MEMS device forms part of an actuator of a camera module.

9. The MEMS device of claim 8, wherein:
   the camera module is integrated with a digital camera, a smartphone, a personal digital assistant, a tablet computer, a notebook computer, a kiosk, or a portable electronic device.

10. A device comprising:
    a fixed frame;
    a platform that is moveable relative to the fixed frame; and
    an actuator interconnecting the fixed frame and the platform, wherein the actuator is adapted to move the platform in at least one degree of freedom, and wherein the actuator comprises:
    a first frame comprising a spine, wherein the spine comprises a spine body and a spine tip;
    a second frame coupled to the first frame and comprising a shock stop, wherein the shock stop comprises a shock stop surface in proximity to the spine tip; and
    a shock cushion spring fixed to the spine tip and situated substantially between the spine tip and the shock stop surface, wherein the shock stop surface is adapted to limit a range of relative motion of the first and second frames, and wherein the shock cushion spring is adapted to protect the spine tip from contact with the shock stop surface.

11. The device of claim 10, wherein:
    the shock cushion spring is separated from the shock stop by a gap adapted to allow the first and second frames to move relative to each other in one or more directions substantially parallel to the shock stop surface; and
    the one or more directions and/or a width of the gap depend, at least in part, on physical characteristics of an intra-actuator flexure moveably connecting the first and second frames.

12. The device of claim 10, wherein the shock cushion spring comprises:
    a compliant member adapted to flex in response to contact with the shock stop and substantially return to an initial shape when not in contact with the shock stop; and
    one or more attachment members adapted to fix corresponding ends of the compliant member relative to the spine tip and provide structural support for the compliant member.

13. The device of claim 10, further comprising:
a travel limiter fixed relative to the spine tip and situated substantially between the spine tip and a compliant member of the shock cushion spring, wherein the travel limiter is separated from the compliant member by a gap adapted to allow the compliant member to flex in response to contact with the shock stop until the compliant member contacts the travel limiter.

14. The device of claim 10, wherein:
the second frame comprises a second spine comprising a second spine body and a second spine tip;
the first frame comprises a second shock stop comprising a second shock stop surface in proximity to the second spine tip; and
the actuator comprises a second shock cushion spring fixed relative to the second spine tip and situated substantially between the second spine tip and the second shock stop surface, wherein the second shock cushion spring is adapted to protect the second spine tip from contact with the second shock stop surface.

15. The device of claim 10, wherein:
the first and second frames are adapted to rotate relative to each other when the actuator is energized; and
a long dimension of the shock cushion spring is substantially parallel to a direction of the rotation.

16. The device of claim 10, wherein:
the first and second frames are arranged substantially in a plane and are adapted to move relative to each other in the plane when the actuator is energized; and
a long dimension of the shock cushion spring is substantially perpendicular to the plane.

17. The device of claim 16, wherein the actuator is a first actuator, the shock cushion spring is a first shock cushion spring, and the first frame is the fixed frame, further comprising a second actuator interconnecting the second frame to the platform, wherein:
the second actuator comprises a third frame substantially fixed relative the second frame and a fourth frame movably connected to the third frame;
the third and fourth frames are arranged to rotate relative to each other when the second actuator is energized; and
a long dimension of a second shock cushion spring of the second actuator is substantially parallel to a direction of the rotation.

18. The device of claim 10, wherein:
the device forms part of an actuator of a camera module.

19. The device of claim 18, wherein:
the camera module is integrated with a digital camera, a smartphone, a personal digital assistant, a tablet computer, a notebook computer, a kiosk, or a portable electronic device.

20. A method comprising:
forming a spine in a first frame of a microelectromechanical (MEMS) device, wherein the spine comprises a spine body and a spine tip;
forming a shock stop in a second frame of the MEMS device, wherein the shock stop comprises a shock stop surface in proximity to the spine tip; and
forming a shock cushion spring fixed to the spine tip, wherein the shock cushion spring is adapted to protect the spine tip from contact with the shock stop surface.

21. The method of claim 20, further comprising arranging the first and second frames and the shock cushion spring such that the shock cushion spring is situated substantially between the spine tip and the shock stop surface, wherein:
the shock cushion spring is separated from the shock stop by a gap adapted to allow the first and second frames to move relative to each other in one or more directions substantially parallel to the shock stop surface; and
the one or more directions and/or a width of the gap depend, at least in part, on physical characteristics of an intra-actuator flexure moveably connecting the first and second frames.

22. The method of claim 21, wherein the forming the shock cushion spring comprises:
forming a compliant member adapted to flex in response to contact with the shock stop and substantially return to an initial shape when not in contact with the shock stop; and
forming one or more attachment members adapted to fix corresponding ends of the compliant member relative to the spine tip and provide structural support for the compliant member.

* * * * *